United States Patent
Ikeda et al.

(10) Patent No.: US 10,511,282 B2
(45) Date of Patent: Dec. 17, 2019

(54) CRYSTAL-OSCILLATING DEVICE AND MANUFACTURING METHOD THEREFOR

(71) Applicant: Murata Manufacturing Co., Ltd., Nagaokakyo-shi, Kyoto-fu (JP)

(72) Inventors: Isao Ikeda, Nagaokakyo (JP); Jinya Furui, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 468 days.

(21) Appl. No.: 15/289,361

(22) Filed: Oct. 10, 2016

(65) Prior Publication Data

US 2017/0026027 A1  Jan. 26, 2017

Related U.S. Application Data

(63) Continuation of application No. PCT/JP2015/052118, filed on Jan. 27, 2015.

(30) Foreign Application Priority Data

Apr. 24, 2014  (JP) .................................. 2014-090080

(51) Int. Cl.
*H03H 9/10* (2006.01)
*H03H 9/17* (2006.01)

(52) U.S. Cl.
CPC ................ *H03H 9/10* (2013.01); *H03H 9/17* (2013.01)

(58) Field of Classification Search
CPC .......... H03H 9/10; H03H 9/1021; H03H 9/17; H03H 9/101; H03H 9/02; H03H 9/1035; H03H 9/105
See application file for complete search history.

(56) References Cited

U.S. PATENT DOCUMENTS 4,288,284 A * 9/1981 Kobayashi .............. G04F 5/063
216/41
5,701,048 A * 12/1997 Kaida .................. H03H 9/0595
310/321

(Continued)

FOREIGN PATENT DOCUMENTS

JP         54078690 A  *  6/1979  ........... H03H 9/1035
JP      2008-017408 A     1/2008

(Continued)

OTHER PUBLICATIONS

International Search Report issued for PCT/JP2015/052118, dated Mar. 24, 2015.

(Continued)

*Primary Examiner* — J. San Martin
(74) *Attorney, Agent, or Firm* — Arent Fox LLP

(57) ABSTRACT

A crystal-oscillating device is disclosed with a reduction in size and a favorable Q value. The crystal-oscillating device includes a first packaging material; a crystal resonator mounted on the first packaging material; joining members that join the first packaging material to the crystal resonator; a first sealing frame for joining the second and third packaging materials, the first packaging material, and the second packaging material; and a second sealing frame for joining the second packaging material and the third packaging material to each other. Preferable, the second packaging material is formed in a frame shape to surround an outer peripheral edge of the crystal resonator, and the second packaging material and a crystal substrate of the crystal resonator are formed from the same crystal substrate.

12 Claims, 8 Drawing Sheets

(56) References Cited

U.S. PATENT DOCUMENTS

| | | | | |
|---|---|---|---|---|
| 5,717,365 | A * | 2/1998 | Kaida | H03H 9/0211 |
| | | | | 310/348 |
| 6,369,489 | B1 * | 4/2002 | Sawai | H03H 9/09 |
| | | | | 310/321 |
| 6,987,347 | B2 * | 1/2006 | Yoshio | H03H 9/0207 |
| | | | | 310/320 |
| 8,766,513 | B2 | 7/2014 | Mizusawa | |
| 2005/0200240 | A1 * | 9/2005 | Tanaka | H03H 9/02086 |
| | | | | 310/333 |
| 2012/0074816 | A1 | 3/2012 | Mizusawa | |
| 2013/0049541 | A1 | 2/2013 | Amano et al. | |
| 2017/0179922 | A1 * | 6/2017 | Nakamura | H03H 9/172 |
| 2018/0323768 | A1 * | 11/2018 | Ikeda | H03H 9/0595 |

FOREIGN PATENT DOCUMENTS

| | | |
|---|---|---|
| JP | 2010-041550 A1 | 2/2010 |
| JP | 2011-193175 A | 9/2011 |
| JP | 2012-074837 A | 4/2012 |
| JP | 2013-046120 A | 3/2013 |
| JP | 5188948 B2 * | 4/2013 |

OTHER PUBLICATIONS

Written Opinion of the International Searching Authority issued for PCT/JP2015/052118, dated Mar. 24, 2015.

* cited by examiner

CRYSTAL-OSCILLATING DEVICE AND MANUFACTURING METHOD THEREFOR

CROSS REFERENCE TO RELATED APPLICATIONS

The present application is a continuation of PCT/JP2015/052118 filed Jan. 27, 2015, which claims priority to Japanese Patent Application No. 2014-090080, filed Apr. 24, 2014, the entire contents of each of which are incorporated herein by reference.

TECHNICAL FIELD

The present disclosure relates to a crystal-oscillating device in which a crystal resonator is sealed by a packaging material.

BACKGROUND

Crystal-oscillating devices have been widely used in portable electronic apparatuses. For example, Patent Document 1 identified below discloses a crystal-oscillating device in which a crystal oscillation plate is sealed by a packaging material. In Patent Document 1, the crystal oscillation plate and the packaging material are connected and fixed to each other by an inner electrode.

In addition, Patent Document 2 identified below discloses a crystal-oscillating device that includes a crystal resonator and a packaging material having an upper frame portion and a lower frame portion. In the crystal-oscillating device in Patent Document 2, the crystal resonator is held between the upper frame portion and the lower frame portion of the packaging material. That is, in the crystal-oscillating device in Patent Document 2, the crystal resonator is directly connected to the packaging material.

Patent Document 1: Japanese Unexamined Patent Application Publication No. 2011-193175.

Patent Document 2: Japanese Unexamined Patent Application Publication No. 2008-17408.

In recent years, along with size reduction of a portable electronic apparatus, size reduction of a crystal-oscillating device is also required. However, in the crystal-oscillating device in Patent Document 1, to accurately mount the crystal oscillation plate on the size-reduced packaging material, the size of the crystal oscillation plate itself must be reduced as well. In this case, it is not possible to ensure a sufficient oscillation portion, which, as a result, impairs the Q value of the crystal resonator in some cases.

In addition, in a configuration in which a crystal resonator is directly connected to a packaging material as in Patent Document 2, a stable Q value cannot be obtained in some cases due to oscillation or stress from the packaging material propagating to the crystal resonator.

SUMMARY OF THE INVENTION

An object of the present disclosure is to provide a crystal-oscillating device that can be reduced in size and has a favorable Q value, and a manufacturing method for the crystal-oscillating device.

A crystal-oscillating device a disclosed herein includes a first packaging material having a crystal resonator mounting surface; a crystal resonator mounted on the crystal resonator mounting surface of the first packaging material; a joining member that electrically connects and mechanically joins the first packaging material and the crystal resonator to each other. Moreover, second and third packaging materials are laminated on the first packaging material to form a sealing space together with the first packaging material such that the crystal resonator is sealed therein. Preferably, a first sealing frame is provided so as to join the first packaging material and the second packaging material to each other, and a second sealing frame provided so as to join the second packaging material and the third packaging material to each other. The second packaging material is formed in a frame shape so as to surround an outer peripheral edge of the crystal resonator, and the second packaging material and a crystal substrate of the crystal resonator are formed from the same crystal substrate.

In a specific aspect of the crystal-oscillating device, the second packaging material is formed so as to surround the outer peripheral edge of the crystal resonator across the sealing space.

In another specific aspect of the crystal-oscillating device, the crystal-oscillating device further includes a damping material that connects the second packaging material and the crystal resonator to each other. Preferably, the second packaging material is formed so as to surround the outer peripheral edge of the crystal resonator across the damping material.

In another specific aspect of the crystal-oscillating device, an electronic component is mounted on a surface of the first packaging material opposite to the surface of the first packaging material on which the crystal resonator is mounted, and the first to third packaging materials, the crystal substrate for forming the crystal resonator, and the electronic component are formed from the same crystal substrate.

In still another specific aspect of the crystal-oscillating device, the second packaging material and the crystal substrate of the crystal resonator have thicknesses equal to each other. Moreover, an upper surface and a lower surface of the second packaging material are flush with the crystal substrate for forming the crystal resonator.

A manufacturing method for a crystal-oscillating device is disclosed herein that includes a step of preparing a crystal substrate; a step of trimming the crystal substrate to form a crystal resonator portion and a frame-shaped packaging material formed so as to surround an outer peripheral edge of the crystal resonator forming portion. The method further includes a step of mounting first and second excitation electrodes for oscillating a crystal resonator, on the crystal resonator forming portion; joining the first and second excitation electrodes mounted on the crystal resonator portion to a first packaging material by one or more joining members; and attaching first and third packaging materials to the second packaging material by using first and second sealing frames to form a sealing space.

In a specific aspect of the manufacturing method for the crystal-oscillating device, the step of trimming the crystal substrate is a step of trimming a portion of the crystal substrate to form the crystal resonator forming portion and the frame-shaped second packaging material portion of which a portion is connected to the crystal resonator forming portion and which is formed so as to surround the outer peripheral edge of the crystal resonator forming portion, moreover, the method further includes trimming a connection portion between the crystal resonator forming portion and the second packaging material portion to remove the connection portion, after the step of joining the first and second excitation electrodes mounted on the crystal resonator forming portion and the first packaging material to each other by the joining member.

In another specific aspect of the manufacturing method for the crystal-oscillating device, the method further includes, after the crystal substrate present between the outer peripheral edge of the crystal resonator forming portion and an inner peripheral edge of the frame-shaped second packaging material portion is fully removed in the step of trimming the crystal substrate, inserting a damping material into a portion where the crystal substrate is removed.

In another specific aspect of the manufacturing method for the crystal-oscillating device, the method further includes a step of forming first and second mask layers for protecting the crystal substrate on first and second principal surfaces of the crystal substrate before the step of trimming the crystal substrate.

In still another specific aspect of the manufacturing method for the crystal-oscillating device, in the step of forming the first and second mask layers, the first and second mask layers are formed such that tension of the first mask layer and tension of the second mask layer are equal to each other.

In the crystal-oscillating device and the manufacturing method for the crystal-oscillating device, the crystal resonator and the second packaging material are formed from the same crystal substrate. Therefore, it is possible to accurately mount the crystal resonator on the size-reduced packaging material without reducing the size of the crystal resonator. Accordingly, a oscillation portion of the crystal resonator is ensured with a sufficient size, and it is possible to stably obtain a favorable Q value. In addition, in the crystal-oscillating device according to the present invention, since the crystal resonator and the first to third packaging materials are not directly connected to each other, stress or oscillation from the packaging materials is hard to propagate to the crystal resonator.

Therefore, according to the crystal-oscillating device and the manufacturing method for the crystal-oscillating device as disclosed herein, it is possible to provide a crystal-oscillating device that is allowed to be reduced in size and has a favorable Q value.

DETAILED DESCRIPTION OF EMBODIMENTS

Hereinafter, specific embodiments of the present invention will be described with reference to the drawings to clarify the present invention and disclosure herein.

(Crystal Vibration Device)

Figure 1A:
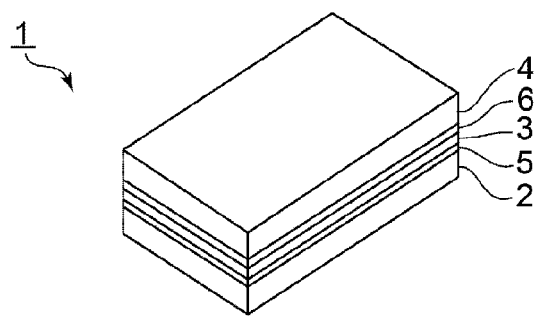
FIG. 1(a) is a perspective view of a crystal-oscillating device according to an exemplary embodiment.
Figure 1B:
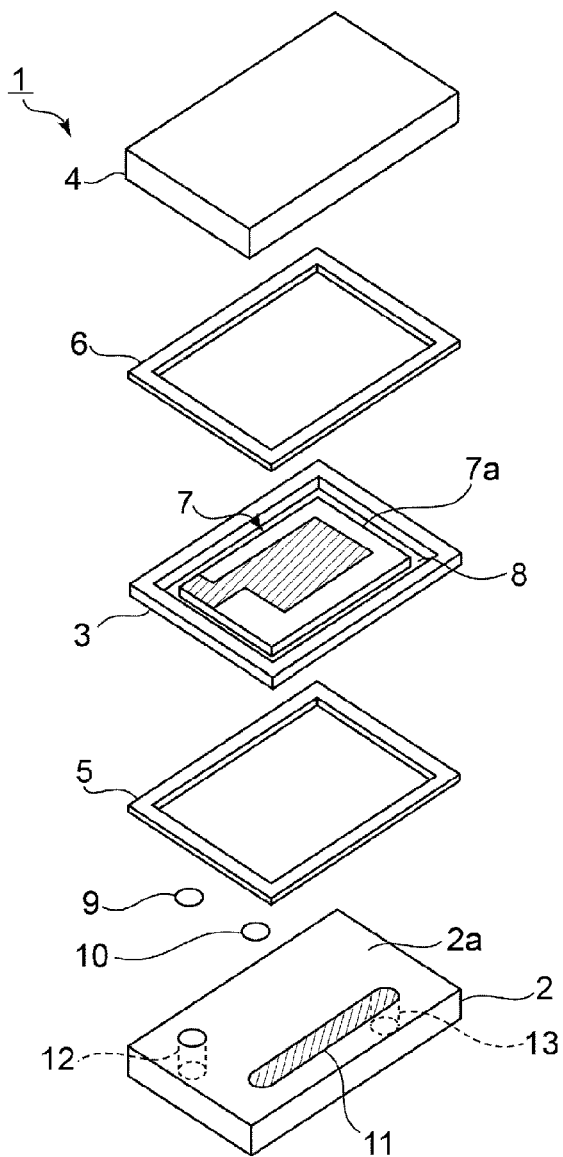
FIG. 1(b) is an exploded perspective view of the crystal-oscillating device.

FIG. 1(a) is a perspective view of a crystal-oscillating device according to an embodiment of the present invention, and FIG. 1(b) is an exploded perspective view of the crystal-oscillating device.

The crystal-oscillating device 1 includes a first packaging material 2 having a crystal resonator mounting surface 2a. In the present embodiment, the first packaging material 2 has a rectangular plate shape. Preferably, the first packaging material 2 is formed from an AT-cut crystal substrate. However, the first packaging material 2 may be formed from an insulating ceramic material such as alumina or an appropriate insulating material such as a synthetic resin, and the material of the first packaging material 2 is not particularly limited.

A crystal resonator 7 is mounted on the crystal resonator mounting surface 2a of the first packaging material 2. The crystal resonator 7 includes a crystal substrate 7a. The crystal substrate 7a has a rectangular plate shape. The upper surface of the crystal substrate 7a has a pair of long sides and a pair of short sides. A direction along the long sides is defined as a lengthwise direction, and a direction along the short sides is defined as a widthwise direction. The crystal resonator 7 is supported in a cantilevered manner by first and second joining members 9 and 10 near one short side thereof. That is, the crystal resonator 7 is supported at a portion at the one short side thereof, and the short side at the opposite side is a free end.

The first and second joining members 9 and 10 physically support the crystal resonator 7 and also serve as conductive contacts that may be formed by a conductive adhesive containing an appropriate synthetic resin and an appropriate conductive material. An epoxy resin conductive adhesive composed of an epoxy resin and a conductive material dispersed in the epoxy resin is desirably used. In this case, it is possible to further sufficiently increase the joining strength. Solder may be used instead of the conductive adhesive.

Figure 2A:
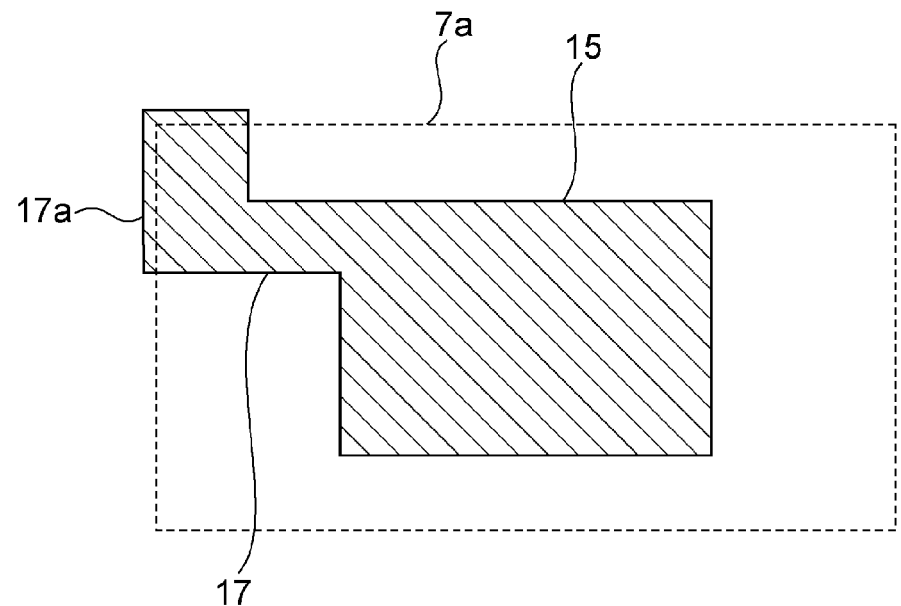
FIG. 2(a) is a schematic plan view showing an electrode shape on the upper surface of a crystal resonator used in the crystal-oscillating device according to the exemplary embodiment and FIG. 2(b) is a schematic plan view showing an electrode shape on the lower surface of the crystal resonator.
Figure 2B:
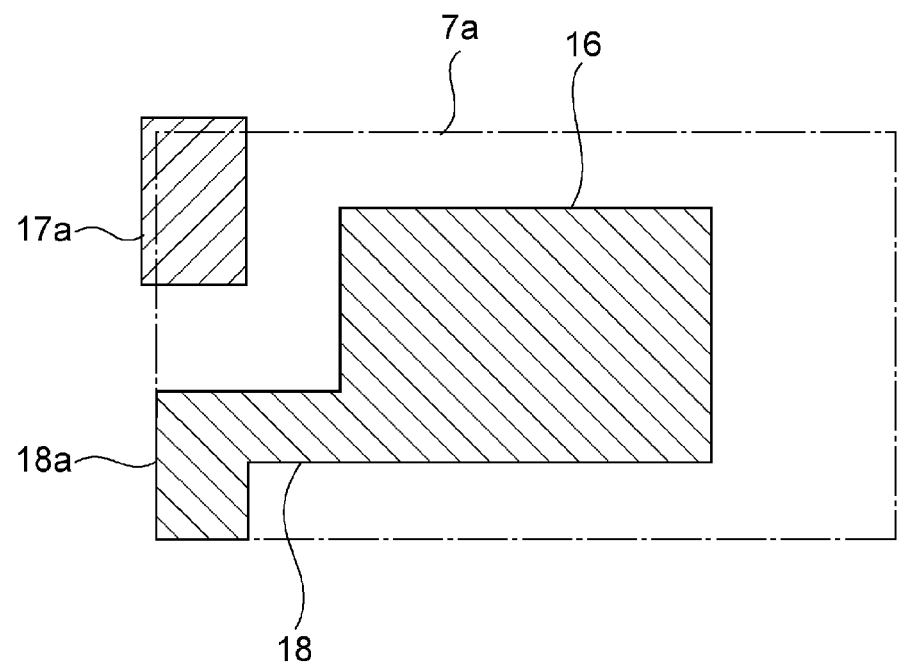

A first excitation electrode 15 shown in FIG. 2(a) is formed on the upper surface of the crystal substrate 7a. A second excitation electrode 16 shown in FIG. 2(b) is formed on the lower surface of the crystal substrate 7a. The first and second excitation electrodes 15 and 16 are formed so as to overlap each other across the crystal substrate 7a. In addition, the first and second excitation electrodes 15 and 16 are partially formed on the upper surface and the lower surface of the crystal substrate 7a.

A first extended electrode 17 is connected to the first excitation electrode 15. The first extended electrode 17 extends on the upper surface of the crystal substrate 7a and the side surface of the crystal substrate 7a at one short side and reaches the lower surface of the crystal substrate 7a. That is, an extended electrode portion 17a shown in FIG. 2(*a*) is located on the lower surface of the crystal substrate 7a shown in FIG. 2(*b*).

Meanwhile, a second extended electrode 18 is connected to the second excitation electrode 16. The second extended electrode 18 has an extended electrode portion 18a at one of the short sides of the crystal substrate 7a. The extended electrode portion 17a and the extended electrode portion 18a are located at both sides, in the widthwise direction, of the lower surface of the crystal substrate 7a. The extended electrode portions 17a and 18a correspond to portions joined by the first and second joining members 9 and 10, respectively.

Preferably, each of the first and second excitation electrodes 15 and 16 and the first and second extended electrodes 17 and 18 is formed from an appropriate metal such as Al or Cu, or an alloy.

As shown in FIG. 1(*b*), the crystal resonator 7 is mounted on the crystal resonator mounting surface 2a of the first packaging material 2. The first packaging material 2 also has a rectangular flat shape. The crystal resonator 7 is mounted on the first packaging material 2 such that the widthwise direction of the crystal substrate 7a coincides with the widthwise direction of the first packaging material 2. The lengthwise direction of the crystal substrate 7a coincides with the lengthwise direction of the first packaging material 2.

In the first packaging material 2, first and second via hole electrodes 12 and 13 are provided so as to extend through the thickness direction of the first packaging material 2. The first and second via hole electrodes 12 and 13 are provided for electrically connecting the first and second joining members 9 and 10 to first and second terminal electrodes that are provided on a surface of the first packaging material 2 opposite to the crystal resonator mounting surface 2a and are not shown. In the present embodiment, the second via hole electrode 13 and the second joining member 10 are joined to each other via a wire electrode 11. In addition, the first and second terminal electrodes, which are not shown, are connected to an external electrode.

Second and third packaging materials 3 and 4 are formed on the first packaging material 2. The second and third packaging materials 3 and 4 form a sealing space together with the first packaging material 2 such that the crystal resonator 7 is sealed therein. The first packaging material 2 can be seen as a lower packaging material and the third packaging material 4 can be seen as an upper packaging material.

The second packaging material 3 is a frame-like body. The second packaging material 3 is formed so as to surround the outer peripheral edge of the crystal resonator 7. In the present embodiment, the second packaging material 3 is formed so as to surround the outer peripheral edge of the crystal resonator 7 across a gap 8.

Figure 3:
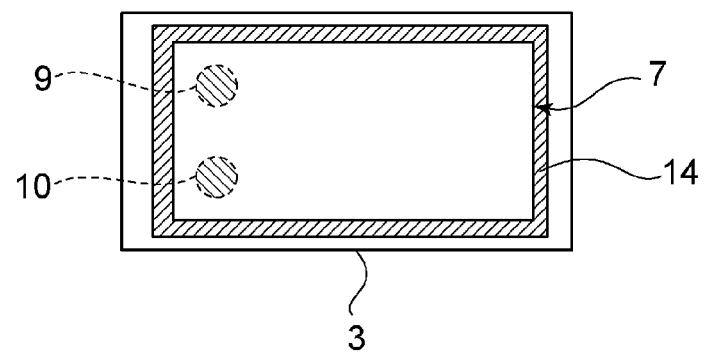
FIG. 3 is a schematic plan view showing a state where a damping material is provided between a second packaging material and the crystal resonator in the crystal-oscillating device according to the exemplary embodiment.

However, as shown in a plan view of FIG. 3, a damping material 14 may be provided between the inner peripheral edge of the second packaging material 3 and the outer peripheral edge of the crystal resonator 7 so as to connect the second packaging material 3 to the crystal resonator 7. That is, the second packaging material 3 may be formed so as to surround the outer peripheral edge of the crystal resonator 7 across the damping material 14. By providing the damping material 14, it is possible to stably fix the crystal resonator 7 within a package without blocking oscillation of AT cut.

As described above, the crystal resonator 7 and the first to third packaging materials 2 to 4 are not directly connected to each other, so that stress or oscillation from the first to third packaging materials 2 to 4 is hard to propagate to the crystal resonator 7. Therefore, the crystal-oscillating device 1 disclosed herein provides a favorable Q value and excellent reliability.

The second packaging material 3 is formed from a crystal substrate that is the same as the crystal substrate 7a for forming the crystal resonator 7. Preferably, the crystal substrate 7a is an AT-cut crystal substrate.

In addition, in the present embodiment, the thickness of the crystal substrate 7a for forming the crystal resonator 7 is equal to the thickness of the second packaging material 3. The upper surface and the lower surface of the crystal substrate 7a for forming the crystal resonator 7 are flush with the upper surface and the lower surface of the second packaging material 3, respectively. However, the thicknesses of the crystal substrate 7a and the second packaging material 3 may be different from each other, and the upper surface and the lower surface of the crystal substrate 7a may not be flush with the upper surface and the lower surface of the second packaging material 3.

The third packaging material 4 has a rectangular plate shape. In the present embodiment, the third packaging material 4 is formed from a crystal substrate. However, the third packaging material 4 may be formed from another material.

A first sealing frame 5 is provided between the first packaging material 2 and the second packaging material 3. The first packaging material 2 and the second packaging material 3 are joined to each other by the first sealing frame 5. The first sealing frame 5 has the same shape and size as those of the second packaging material 3, and is provided so as to overlap the second packaging material 3. In addition, the first sealing frame 5 and the second packaging material 3 are provided such that the outer peripheral edges thereof overlap the outer peripheral edge of the first packaging material 2.

Meanwhile, a second sealing frame 6 is provided between the second packaging material 3 and the third packaging material 4. The second packaging material 3 and the third packaging material 4 are joined to each other by the second sealing frame 6. The second sealing frame 6 has the same shape and size as those of the second packaging material 3. The second sealing frame 6 is provided so as to overlap the second packaging material 3. In addition, the second sealing frame 6 and the second packaging material 3 are provided such that the outer peripheral edges thereof overlap the outer peripheral edge of the third packaging material 4.

However, as long as the first and second sealing frames 5 and 6 are able to seal the crystal resonator 7, the first and second sealing frames 5 and 6 may have a shape and a size different from those of the second packaging material 3, and the positions at which the first and second sealing frames 5 and 6 are provided are also not limited.

Each of the first and second sealing frames 5 and 6 are formed from a sealing material such as an alloy formed by metal plating. Au, Sn, or an alloy thereof is preferably used as the sealing material. When each of the first and second sealing frames 5 and 6 is formed from a metal, the first to third packaging materials 2 to 4 are preferably attached together by fusing the first and second sealing frames 5 and 6 by means of heating. The first sealing frame 5 forms a joining layer between the first packaging material 2 and the second packaging material 3, and the second sealing frame 6 forms a joining layer between the second packaging material 3 and the third packaging material 4. Therefore, by the first and second sealing frames 5 and 6, the crystal resonator 7 is sealed, and a gap for not blocking oscillation of the crystal resonator 7 is formed.

As shown in the crystal-oscillating device 1 according to the exemplary embodiment, the crystal substrate used to form the crystal resonator and the second packaging material are formed from the same crystal substrate. Therefore, it is possible to accurately mount the crystal resonator on the size-reduced packaging material without reducing the size of the crystal resonator. Thus, a sufficient oscillation portion of the crystal resonator is ensured, so that it is possible to stably obtain a favorable Q value. In addition, as described above, the crystal resonator and the first to third packaging materials are not directly connected to each other, so that stress or oscillation from the first to third packaging materials is hard to propagate to the crystal resonator. As a result, the disclosed crystal-oscillating device has a favorable Q value and excellent reliability.

(Manufacturing Method for Crystal Vibration Device)

A manufacturing method for the crystal-oscillating device 1 is not particularly limited, but an example of the manufacturing method will be described with reference to FIGS. 4(a) to 4(c).

Figure 4A:
FIGS. 4(a) and 4(b) are schematic plan views of a crystal resonator used in a manufacturing method for the crystal-oscillating device according to the exemplary embodiment.

First, an AT-cut crystal substrate 19 shown in FIG. 4(a) is prepared. Thereafter, as shown in FIG. 4(b), the crystal substrate 19 is partially trimmed, thereby forming a frame-shaped second packaging material portion 19a and a crystal resonator forming portion 19b. The second packaging material portion 19a and the crystal resonator forming portion 19b are connected to each other via a connection portion 19c. The second packaging material portion 19a is formed so as to surround the outer peripheral edge of the crystal resonator forming portion 19b.

Hereinafter, an example of a method for trimming the crystal substrate 19 will be described in detail with reference to FIGS. 5(a) to 5(d) and FIGS. 6(a) to 6(d).

Figure 5A:
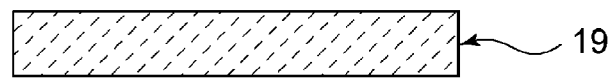
FIGS. 5(a) to 5(d) are cross-sectional views for illustrating an example of a method for trimming a crystal substrate in the manufacturing method for the crystal-oscillating device.
Figure 5B:
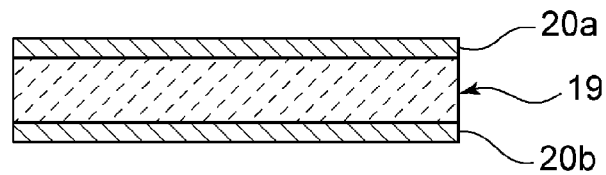

First, as shown in FIG. 5(a), the AT-cut crystal substrate 19 is prepared. Next, as shown in FIG. 5(b), first and second metal thin films 20a and 20b are formed on an upper surface and a lower surface as first and second principal surfaces of the crystal substrate 19. The material forming the first and second metal thin films 20a and 20b is not particularly limited as long as the material has favorable close contact property to crystal, and, for example, Cr, Ti, or the like is used.

Figure 5C:
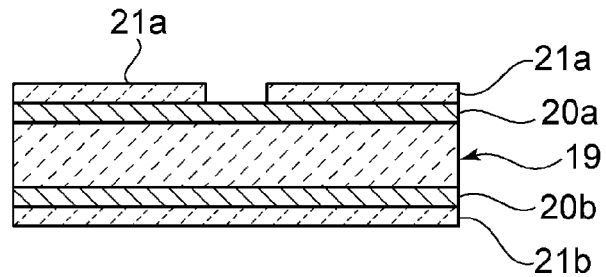

Next, as shown in FIG. 5(c), first and second resist patterns 21a and 21b are formed to be stacked on the first and second metal thin films 20a and 20b. Here, the first resist pattern 21a is not formed in a portion where the crystal substrate 19 is to be trimmed in a subsequent step.

Figure 5D:
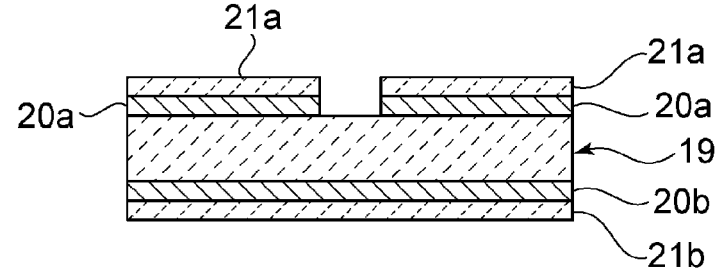
Figure 6A:
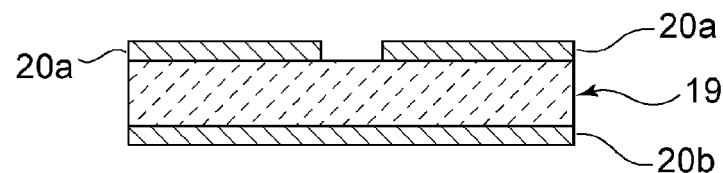
FIGS. 6(a) to 6(d) are cross-sectional views for illustrating the example of the method for trimming the crystal substrate in the manufacturing method for the crystal-oscillating device.

Next, as shown in FIG. 5(d), a portion of the first metal thin film 20a on which the first resist pattern 21a is not formed is removed by etching. Thereafter, as shown in FIG. 6(a), the first and the second resist patterns 21a and 21b are removed by a resist remover.

Figure 6B:
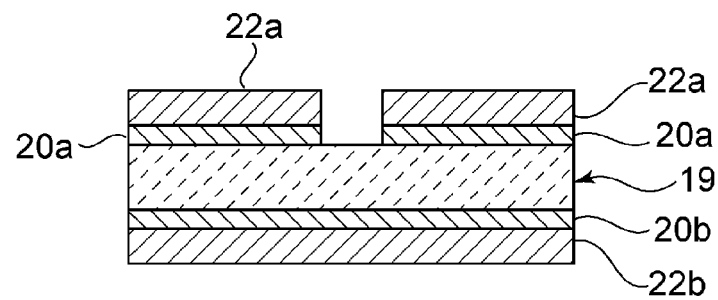

Next, as shown in FIG. 6(b), first and second mask layers 22a and 22b for trimming are formed by plating so as to be stacked on portions where the first and second metal thin films 20a and 20b are provided. The material forming the first and second mask layers 22a and 22b is not particularly limited as long as the material is a metal that is hard to remove by ion etching in a subsequent step, and, for example, Ni or the like is used.

Figure 6C:
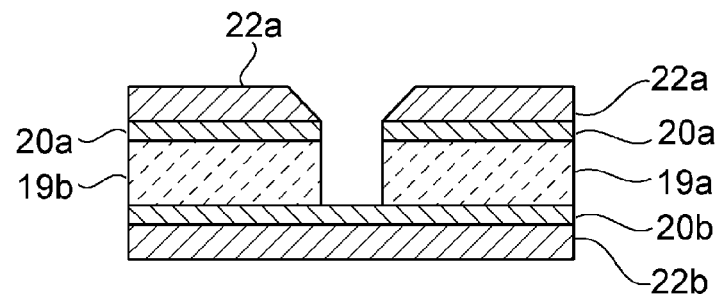
Figure 6D:
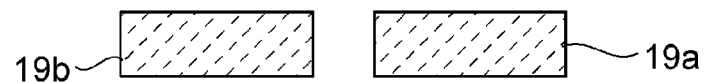
Figure 7A:
FIGS. 7(a) to 7(d) are cross-sectional views for illustrating another example of the method for trimming the crystal substrate in the manufacturing method for the crystal-oscillating device.
Figure 7B:
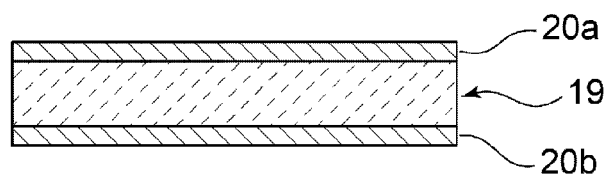
Figure 7C:
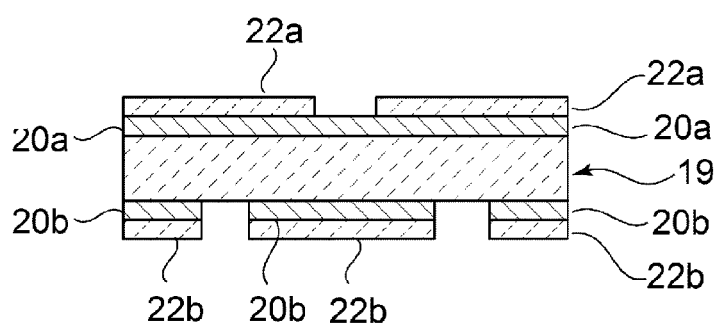
Figure 7D:
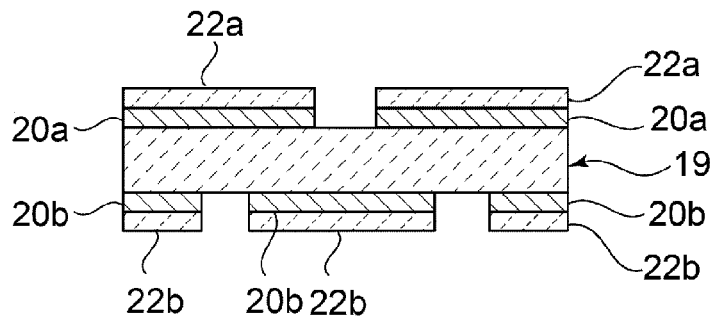
Figure 8A:
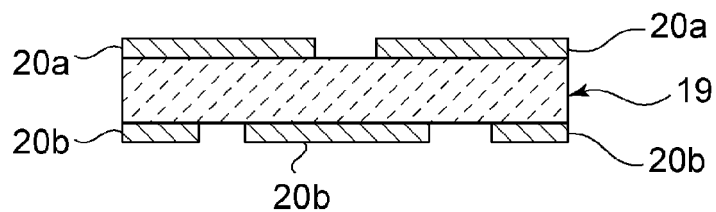
FIGS. 8(a) to 8(d) are cross-sectional views for illustrating the other example of the method for trimming the crystal substrate in the manufacturing method for the crystal-oscillating device.
Figure 8B:
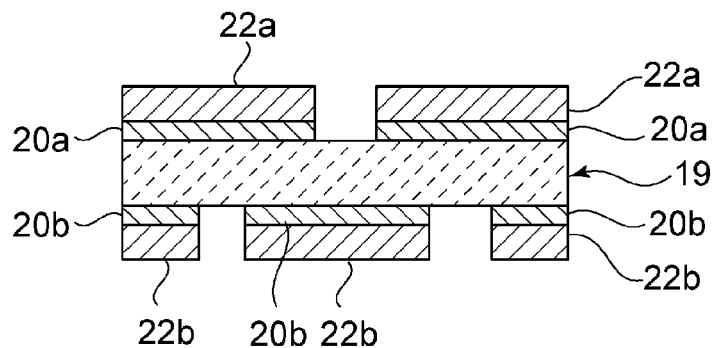
Figure 8C:
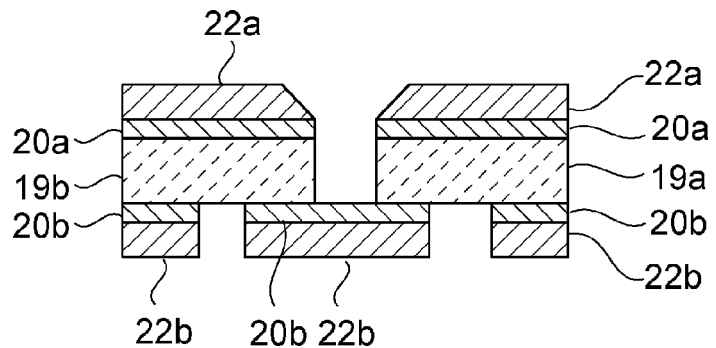
Figure 8D:
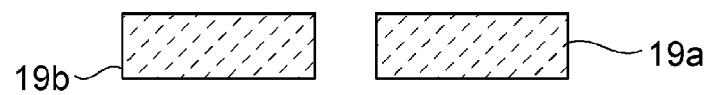

Next, as shown in FIG. 6(c), a portion of the crystal substrate 19, that is, a portion of the crystal substrate 19 where the first mask layer 22a is not provided, is trimmed by ion etching. However, the trimming of the crystal substrate 19 may be performed by another method, and the method for the trimming is not particularly limited as should be understood to one skilled in the art. Moreover, it is possible to obtain the crystal resonator forming portion 19b and the second packaging material portion 19a by the trimming of the crystal substrate 19. Thereafter, as shown in FIG. 6(d), the first and second metal thin films 20a and 20b and the first and second mask layers 22a and 22b are removed by an etching agent.

In trimming the crystal substrate 19, as in another example of a trimming method shown in FIGS. 7(a) to 7(d) and FIGS. 8(a) to 8(d), the second mask layer 22b may be formed such that tension of the first mask layer 22a and tension of the second mask layer 22b are equal to each other. That is, a structure may be provided in which a portion of the second metal thin film 20b is removed and the second mask layer 22b is formed only on the second metal thin film 20b that is not removed. In this case, it is possible to prevent deformation of the crystal substrate 19.

Figure 4B:
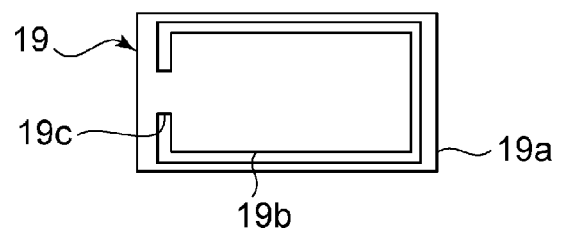
Figure 4C:
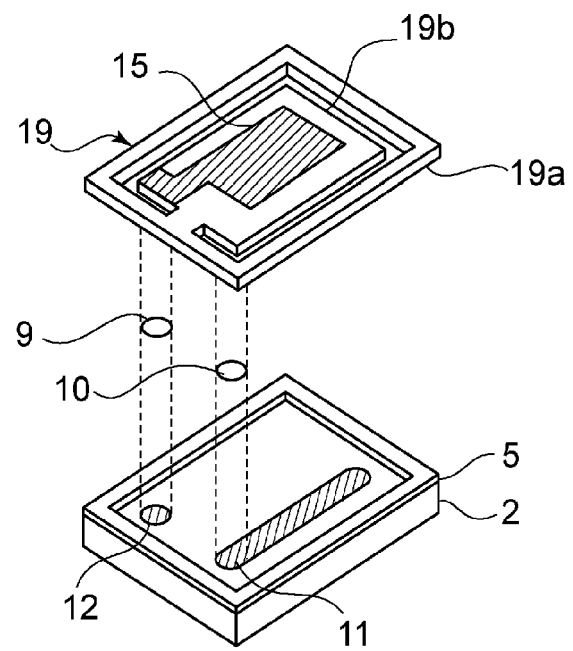
FIG. 4(c) is an exploded perspective view of a portion of the crystal-oscillating device, for illustrating the manufacturing method for the crystal-oscillating device according to the exemplary embodiment.

In the above method, by trimming a portion of the crystal substrate 19, the crystal resonator forming portion 19b and the second packaging material portion 19a shown in FIG. 4(b) are formed.

In the manufacturing method for the crystal-oscillating device 1, next, the first and second excitation electrodes 15 and 16 for oscillating the crystal resonator 7 are mounted on the crystal resonator forming portion 19b.

Thereafter, the first and second excitation electrodes 15 and 16 and the first via hole electrode 12 or the wire electrode 11 at the first packaging material 2 are joined to each other by using the first and second joining members 9 and 10. At this time, as shown in FIG. 4(c), the first packaging material 2 and the second packaging material portion 19a are stacked on each other with the above-described first sealing frame 5 interposed therebetween.

Next, the connection portion 19c is removed by trimming. Thereafter, the third packaging material 4 is stacked on the second packaging material 3 with the second sealing frame 6 interposed therebetween. After stacking, the first and second sealing frames 5 and 6 are fused by heating, thereby attaching the first to third packaging materials 2 to 4 together. Accordingly, the manufacturing method produces the crystal-oscillating device 1 described above.

In the present disclosure, during the trimming of the crystal substrate 19, the connection portion 19c may not be formed, and the crystal substrate 19 present between the inner peripheral edge of the second packaging material portion 19a and the outer peripheral edge of the crystal resonator forming portion 19b may be fully removed by trimming. moreover, the damping material 14 may be inserted in the removed portion. Specifically, for example, after the ion etching in FIG. 6(c), in a state where the crystal resonator forming portion 19b and the second packaging material portion 19a are connected to the second metal thin film 20b, it is possible to insert the damping materials 14 by filling and curing the damping material 14.

By inserting the damping material 14, damage by laser processing is reduced. The material forming the damping material 14 is not particularly limited as long as the material is flexible. For example, silicon or the like can be used for the damping material 14.

As described above, in the crystal-oscillating device according to the present disclosure, the crystal substrate for forming the crystal resonator, and the second packaging material are formed by trimming the single crystal substrate. Therefore, it is possible to mount the crystal resonator on the side-reduced packaging material without reducing the size of the crystal substrate for forming the crystal resonator, and thus a sufficient oscillation portion is ensured. Moreover, since the crystal resonator and the first and third packaging materials are not directly connected to each other, stress or oscillation from the packaging materials is hard to propagate to the crystal resonator. Therefore, the manufacturing method described herein provides a crystal-oscillating device having a favorable Q value and excellent reliability.

In addition, in the present disclosure, an electronic component may be further mounted on the surface of the first packaging material opposite to the surface of the first packaging material on which the crystal resonator is mounted. Preferably, the electronic component, the first, second and third packaging materials, and the crystal substrate of the crystal resonator may be formed from the same crystal substrate. Doing so simplifies the manufacturing process.

REFERENCE SIGNS LIST 1 crystal-oscillating device
2 first packaging material
2a crystal resonator mounting surface
3 second packaging material
4 third packaging material
5, 6 first and second sealing frames
7 crystal resonator
7a, 19 crystal substrate
8 gap
9, 10 first and second joining members
11 wire electrode
12, 13 first and second via hole electrodes
14 damping material
15, 16 first and second excitation electrodes
17, 18 first and second extended electrodes
17a, 18a first and second extended electrode portions
19a second packaging material portion
19b crystal resonator forming portion
19c connection portion
20a, 20b first and second metal thin films
21a, 21b first and second resist patterns
22a, 22b first and second mask layers

The invention claimed is:

1. A crystal-oscillating device comprising:
a first packaging material having a mounting surface;
a crystal resonator formed from a crystal substrate and mounted on the mounting surface of the first packaging material by at least one joining member that electrically connects and mechanically joins the first packaging material to the crystal resonator;
a second packaging material laminated above the mounting surface of the first packaging material and having a frame shape to surround an outer peripheral edge of the crystal resonator; and
a third packaging material laminated above the second packaging material opposite the first packaging material to collectively form a sealing space with the first and second packaging materials to seal the crystal resonator therein,
wherein the sealing space completely surrounds the outer peripheral edge of the crystal resonator to define a gap between the outer peripheral edge and the second packaging material, and
wherein the second packaging material and the crystal substrate of the crystal resonator comprise a same crystal substrate.

2. The crystal-oscillating device according to claim 1, further comprising a first sealing frame disposed between the first packaging material and the second packaging material.

3. The crystal-oscillating device according to claim 2, further comprising a second sealing frame disposed between the second packaging material and the third packaging material.

4. The crystal-oscillating device according to claim 1, wherein the second packaging material surrounds the outer peripheral edge of the crystal resonator across the sealing space with the gap therebetween.

5. The crystal-oscillating device according to claim 1, further comprising:
an electronic component mounted on a surface of the first packaging material opposite to the mounting surface of the first packaging material,
wherein the first, second and third packaging materials, the crystal substrate of the crystal resonator, and the electronic component are all formed from the same crystal substrate.

6. The crystal-oscillating device according to claim 1, wherein the second packaging material and the crystal substrate of the crystal resonator comprises equal thicknesses.

7. The crystal-oscillating device according to claim 6, wherein the second packaging material comprise upper and lower surfaces that are flush with the crystal substrate of the crystal resonator.

8. The crystal-oscillating device according to claim 1, wherein the at least one joining member mechanically joins the crystal oscillator to the first packaging material to support the crystal oscillator in a cantilevered position relative to the first packaging material.

9. The crystal-oscillating device according to claim 1, wherein the at least one joining member comprises a pair of joining members electrically coupled to a pair of via hole electrodes, respectively, extending through the first packaging material.

10. The crystal-oscillating device according to claim 9, further comprising a pair of excitation electrodes disposed on opposing sides of the crystal resonator with the pair of excitation electrodes electrically connected to the pair of joining members, respectively.

11. A crystal-oscillating device comprising:
a first packaging material having a mounting surface;
a crystal resonator formed from a crystal substrate and mounted on the mounting surface of the first packaging material by at least one joining member that electrically connects and mechanically joins the first packaging material to the crystal resonator;
a second packaging material laminated above the mounting surface of the first packaging material and having a frame shape to surround an outer peripheral edge of the crystal resonator; and
a third packaging material laminated above the second packaging material opposite the first packaging material to collectively form a sealing space with the first and second packaging materials to seal the crystal resonator therein; and
a damping material disposed in the sealing space between the second packaging material and the outer peripheral edge of the crystal resonator,
wherein the second packaging material and the crystal substrate of the crystal resonator comprise a same crystal substrate.

12. The crystal-oscillating device according to claim 11, wherein the second packaging material surrounds the outer peripheral edge of the crystal resonator across the damping material.

* * * * *